United States Patent
Liu et al.

(10) Patent No.: US 8,486,498 B2
(45) Date of Patent: Jul. 16, 2013

(54) THERMALLY DECOMPOSABLE POLYMER COATED METAL POWDERS

(75) Inventors: Puwei Liu, San Marcos, CA (US); Matthew James Holloway, Naas (IE); Blake Olsen, Irvine, CA (US)

(73) Assignees: Henkel Corporation, Rocky Hill, CT (US); Henkel Ireland Limited, Monheim (DE)

( * ) Notice: Subject to any disclaimer, the term of this patent is extended or adjusted under 35 U.S.C. 154(b) by 239 days.

(21) Appl. No.: 13/113,716

(22) Filed: May 23, 2011

(65) Prior Publication Data

US 2011/0265913 A1 Nov. 3, 2011

Related U.S. Application Data

(63) Continuation of application No. PCT/US2009/065296, filed on Nov. 20, 2009.

(60) Provisional application No. 61/116,812, filed on Nov. 21, 2008.

(51) Int. Cl.
| *A01N 3/00* | (2006.01) |
| *B32B 5/16* | (2006.01) |
| *B01J 13/02* | (2006.01) |
| *C08F 20/06* | (2006.01) |
| *C08F 118/02* | (2006.01) |
| *C08F 32/00* | (2006.01) |

(52) U.S. Cl.
USPC ..... 428/24; 428/403; 427/213.32; 526/317.1; 526/319; 526/308

(58) Field of Classification Search
USPC ............. 428/24, 403; 427/213.32; 526/317.1, 526/319, 308
See application file for complete search history.

(56) References Cited

U.S. PATENT DOCUMENTS

| 3,975,422 A | 8/1976 | Buck |
| 4,012,402 A | 3/1977 | Buck |
| 4,452,861 A | 6/1984 | Okamoto et al. |
| 4,607,091 A | 8/1986 | Schreiber |
| 4,994,326 A | 2/1991 | Shimmura et al. |
| 5,021,484 A | 6/1991 | Schreiber et al. |
| 5,180,752 A | 1/1993 | Melber et al. |
| 5,200,452 A | 4/1993 | Schreiber |
| 5,281,388 A | 1/1994 | Palmer et al. |
| 5,290,825 A | 3/1994 | Lazar |
| 5,315,462 A | 5/1994 | Ohkubo et al. |
| 5,328,522 A | 7/1994 | Sowa et al. |
| 5,369,192 A | 11/1994 | Ko et al. |
| 5,397,611 A | 3/1995 | Wong |
| 5,439,635 A | 8/1995 | Seemann |
| 5,445,911 A | 8/1995 | Russell et al. |
| 5,480,603 A | 1/1996 | Lopez et al. |
| 5,567,499 A | 10/1996 | Cundiff et al. |
| 5,580,656 A | 12/1996 | Melber |
| 5,677,048 A | 10/1997 | Pushaw |
| 5,736,074 A | 4/1998 | Hayes et al. |
| 5,851,336 A | 12/1998 | Cundiff et al. |
| 5,902,535 A | 5/1999 | Burgess et al. |
| 6,077,380 A | 6/2000 | Hayes et al. |
| 6,096,848 A | 8/2000 | Gololobov et al. |
| 6,156,146 A | 12/2000 | Cundiff |
| 6,207,786 B1 | 3/2001 | Ishida et al. |
| 6,294,629 B1 | 9/2001 | O'Dwyer et al. |
| 6,416,863 B1 | 7/2002 | Schulze et al. |
| 6,475,331 B1 | 11/2002 | O'Connor et al. |
| 7,368,167 B2 | 5/2008 | Johnston |
| 2005/0171273 A1 | 8/2005 | Ledwidge et al. |
| 2007/0007692 A1 | 1/2007 | Lehmann et al. |
| 2010/0193973 A1* | 8/2010 | Chae ............................ 257/789 |

FOREIGN PATENT DOCUMENTS

| WO | WO 01/85861 | 11/2001 |
| WO | WO 2010/059924 | 5/2010 |
| WO | WO 2010/091975 | 8/2010 |

OTHER PUBLICATIONS

International Search Report for International Patent Application No. PCT/US09/065296 mailed on Jul. 1, 2010.
S. Rimdusit and H. Ishida, "Development of new class of electronic packaging materials based on ternary system of benzoxazine, epoxy, and phenolic resin," *Polymer*, 41, 7941-7949 (2000).

* cited by examiner

*Primary Examiner* — William Cheung
(74) *Attorney, Agent, or Firm* — Steven C. Bauman

(57) ABSTRACT

The present invention relates to polymer coated metal powders, such as metal powders used in the formation of solder alloys and pastes. The metal powders are coated with curable compositions of cyanoacrylates. The present invention relates to polymer coated metal powders, such as metal powders used in the formation of solder alloys and pastes. The metal powders are coated with curable compositions of cyanoacrylates, and once cured the coating on the metal powder is a cyanoacrylate polymer.

13 Claims, No Drawings

THERMALLY DECOMPOSABLE POLYMER COATED METAL POWDERS

BACKGROUND TO THE INVENTION

1. Field of the Invention

The present invention relates to polymer coated metal powders, such as metal powders used in the formation of solder alloys, spheres and pastes. The metal powders are coated with a thermally decomposable polymer, such as a cyanoacrylate polymer or a dicyclopentadiene ("DCPD") oligomer.

2. Brief Description of Related Technology

Solder is widely used in the assembly of semiconductor packages and semiconductor devices.

For instance, solder balls or spheres are used in the assembly of semiconductor packages, such as in flip chip applications.

Solder paste is commonly used for surface-mounted soldering of electrical components to circuit boards. Solder paste is useful because it can be applied to selected areas of the circuit board with its tackiness characteristic providing the capability of holding the electrical components in position without additional adhesives before forming the permanent bonds as the board passes through the solder reflow process.

Solder paste typically comprises a solder powder, a resinous component such as rosin, activators such as organic acids or amines, rheological control agents, thickeners and solvents. The solder paste is typically coated on the circuit board by techniques such as screen printing, dispensing, and transfer printing. Thereafter, the electrical components are placed on the circuit board and the solder paste is reflowed, by which the solder is heated sufficiently to cause it to melt and thereafter is cooling the solder sufficiently to cause it to solidify.

One problem in the industry associated with the use of solder paste is that it often has a short and unpredictable shelf life, e.g., typically from about one month to six months. The unpredictability in shelf life is caused, at least in part, by variations in the lag time from when the solder powder is made to the time it is mixed with flux to form solder paste, thereby resulting in variations in the degree of oxidation on the solder powder. Such oxidized powder does not reflow as well as unoxidized powder. Further, when the solder powder is combined with flux, which is inherently corrosive, the solder powder often reacts with the flux, thereby oxidizing the powder and reducing the acidity, thus effectiveness, of the flux. As a result, the performance of the solder paste often deteriorates over time. Moreover, the reaction between the solder powder and the flux typically causes the viscosity of the solder paste to increase substantially, which can make printing the solder paste difficult if not impossible depending on pitch.

Attempts have been made to reduce the reaction rate between the solder powder and the flux and thereby increase the shelf life of the solder paste, by storing the solder paste under refrigeration conditions. However, refrigeration is not effective to compensate for the varying degrees of oxidation on the solder powder prior to its incorporation into the solder paste.

It has also been reported that solder powder has been coated with materials that are non-reactive with the solder paste. For example, U.S. Pat. No. 4,994,326 discloses that coating agents that are insoluble or hardly soluble in a vehicle for solder pastes including those based on silicone and fluorine such as, for instance, silicone oils, silicone base high-molecular compounds, fluorinated silicone oils, fluorosilicone resins and fluorinated hydrocarbon base high-molecular compounds, are used as coatings.

The '326 patent also discloses a relatively large mount of coating material which is applied to the solder powder. While the relatively large amount of coating material may be effective to inhibit oxidation of the solder powder, in general, large amounts of coating material are undesirable since they can create a barrier which can inhibit the reflow of the solder. Moreover, such large amounts of coating material may cause physical obstructions and/or impurities which result in poor reflow characteristics, such as inadequate substrate wetting by the flux which can cause poor spreading of the solder and a discontinuous solder connection.

In addition, the '326 patent discloses the use of fluorinated hydrocarbons which are used as solvents in coating the solder powder. Currently, fluorinated hydrocarbons are considered to be an environmental pollutant and the use thereof is generally undesirable.

U.S. Pat. No. 6,416,863 is directed to and claims a method of encapsulating solder metal powder in which the powder is provided with a thin polymer protective layer by a polymerization reaction running on the surface of the solder powder, with the following steps:

a) producing a suspension of powder and a hydrophobic liquid,
b) generating a hydrophobic surface layer on each metal particle by adding a cationic tenside with a chain length of $C_1$ through $C_{20}$ with continuous stirring to form a brush structure on the hydrophobic layer of step (a),
c) stirring the mixture of steps a) and b) until formation of a viscous homogeneous mass,
d) adding a radically polymerizable monomer to the mass of step c) and which forms a thermoplastic polymer with a glass temperature Tg of at least 60° C. below the solidus temperature of the solder powder,
e) adding an organic initiator to start an interfacial polymerization reaction with incorporation of the hydrophobic layer of step b) and formation of a protective layer of thermoplastic polymer which has fluxing agent characteristics,
f) introducing the mass of step e) into an aqueous preparation with continuous stirring, whereby the preparation contains an emulsifier for suspension stabilization and controlling the polymerization reaction by tempering to 50° C. to 90° C. and maintaining this temperature for at least 120 min, and
g) cooling, washing and recovering the encapsulated solder powder of steps e) and f). Suitable monomers for forming the encapsulating wall are reported to be radically polymerizable monomers, preferably methacrylic-2-hydroxyethylester or methylmethacrylate.

U.S. Pat. No. 5,328,522 is directed to and claims a solder paste comprising (i) a flux and
(ii) a coated solder powder comprising solder particles coated with parylene (having a melting point lower than the solder particles) in an amount from about 0.001 to about 0.5 weight percent based on the total weight of the coated solder powder and effective to inhibit oxidation of the solder particles in the solder paste without substantially inhibiting reflow characteristics of the coated solder powder.

U.S. Pat. No. 4,452,861 (Okamoto) describes solid particles encapsulated with cyanoacrylate polymer. The particles are encapsulated to prevent degradation due to reactive or corrosive surroundings. The cyanoacrylate polymer is used to coat phosphor particles and the like which are employed as coatings in cathode ray tubes and the like. Cerium activated calcium sulphide phosphor powder is the exemplified material which is coated.

U.S. Patent Application Publication No. 2005/0171273 describes a curable composition for forming anisotropically conductive bonds comprising:
(i) an amount of a first substantially uncured curable component; and
(ii) conductive particles coated with the cured product of a second curable component, where the coated-conductive particles are dispersed within the first curable component.

Notwithstanding the state-of-the-technology, it would be desirable to provide a curable composition as a coating on metal particles particularly those suitable for use in solder pastes.

SUMMARY OF THE INVENTION

The present invention thus provides a metal powder having a thermally decomposable polymer formed from at least one reactive monomer coated on at least a portion of a surface thereof.

The cured product of the reactive monomer has as its chief function the task of physically isolating the metal particles from environmental degradation, such as oxidation and chemical reaction with flux media. In general the polymer coating acts as a physical barrier toward oxidation while the metal powder and/or solder paste in which the coated metal particle is being stored for use.

The reactive monomer for use on the coating is desirably a cyanoacrylate. Cyanoacrylates cure on exposure to metal particles, and thus from the vantage point of ease of cure are a desirable choice for a protectant. When the cyanoacrylate polymer decomposes, such as during exposure to processing temperatures, such as at the temperature reached during solder reflow, its remnants are simply cyanoacrylate monomers. Cyanoacrylate polymers have a ceiling temperature, above which the polymers revert to the monomers from which they were made. Most polymers, however, have a ceiling temperature that is higher than their degrading temperature. In practice therefore those polymers do not actually observe a ceiling for them. Other polymers, like cyanoacrylate polymers, have a very low ceiling temperature (oftentimes in the range of about 120 to about 150° C.).

The cyanoacrylate monomers may generally be represented by the formula:

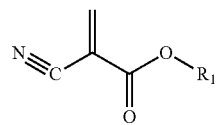

where $R^1$ is $C_1$-$C_{40}$ alkyl, $C_3$-$C_{40}$ cycloalkyl, or $C_2$-$C_{40}$ alkenyl group, with hydroxyl or alkoxy functionality and/or ether linkages being optional.

Suitable cyanoacrylate monomers are alkyl, alkenyl and alkoxy cyanoacrylate esters, more particularly where the alkyl or alkenyl group of such esters has up to 10 carbon atoms. The cyanoacrylate monomer may be selected from methyl, ethyl, n-propyl, iso-propyl, n-butyl, iso-butyl, sec-butyl, tert-butyl, n-pentyl, iso-pentyl, n-hexyl, iso-hexyl, n-heptyl, iso-heptyl, n-octyl, n-nonyl, allyl, methoxyethyl, ethoxyethyl, 3-methoxybutyl and methoxyisopropyl cyanoacrylate esters.

The cyanoacrylates may further contain dyes and pigments (compatible with the cyanoacrylate), to permit inspection of the degree of coverage of whether a coating is on the metal particles or the degree of coverage of the coatings on the particles.

Examples of suitable colourants include 1-hydroxy-4-[4-methyl-phenylamino]-9,10 antracenedione (D+C Violet No. 2); disodium salt of 6-hydroxy-5-[(4-sulfophenyl)axo]-2-naphthylenesulphonic acid (FD+C Yellow No. 6); 9-(o-carboxyphenyl)-6-hydroxy-2,4,5,7-tetraiodo-3H-xanthenen-3-one, disodium salt, monohydrate (FD+C Red No. 3); 2-(13dihydro-3-oxo-5-sulfo-2H-indole-2-ylidine)-2,3-dihydro-3-oxo-1H-indole-5-sulfonic acid disodium salt (FD+C Blue No. 2); and phthalocyaninato (2-) copper.

Cure accelerators may be employed in the cyanoacrylate, in the event that a metal particle which is to be coated is somewhat slow to react with the cyanoacrylate. These include the accelerators disclosed in International Patent Application Publication No. WO 01/85861, hereby incorporated in its entirety by reference. Other examples of cure accelerators suitable for use here include U.S. Pat. Nos. 6,475,331 (Grismala) and 6,294,629 (O'Dwyer), both of which are hereby incorporated in their entirety by reference.

Other polymers may be used as well as protectants for the metal powders, provided their ceiling temperatures are below the degradation temperature of the polymer and below the melting point of the metal particle. Thus, polymers having useful ceiling temperatures have a ceiling temperature in the range of 25° C.-250° C. In the case of metal particles that are solder powders, a polymer having a ceiling temperature in the range of 25° C.-250° C. can be useful. A ceiling temperature in the range of 80° C.-200° C. is particularly useful. For instance, DCPD polymers are useful.

In certain applications the metal particles will be placed between two substrates, for example between two conductive substrates such as in a semiconductor package application, so that the particle must be sufficiently uncoated to form a conductive pathway between the substrates it bridges. In such circumstances the bringing together of the substrates may be sufficient to "flatten" (deform by pressing upon) the metal particle and break the coating sufficiently.

The metal particles may be mono-sized, i.e., substantially of the same dimensions. This may be important if the bond gap formed is a semiconductor package or assembly, for instance is desirably of a particular size. However, particles of varying dimensions can be used, so as to have a relatively wide distribution of diameters about a mean value such as from about 0.5 to about 100 µm in at least one dimension, desirably about 3 to about 50 µm. In particular, it is desirable that the coated particles are spherical in shape.

Desirably the coating on the particles is less than about 3 µm, more particularly in the range from about 0.001 to about 0.2 µm, such as from 0.004 to about 0.4 µm, for example from about 0.01 to about 0.1 µm. The coating on the particles can also be determined as a function of weight gain on the particles after the coating process.

The polymer coating on the metal particles lends to the stability of the metal particles, and of formulations in which the coated metal particles are used, by mitigating against the reactivity of the particles towards environmental contaminates or in the case of a formulation, such as solder paste, other components that are used to form the formulation.

In the context of a solder reflow process, after application of the solder paste, the polymer coating of at least some of the metal particles is at least partially removed by exposure to the elevated temperatures reached during reflow so as to expose the surface of the metal particle, i.e., here, the solder powder. The polymer coating may also be at least partially removed by physical breaking (for example by applying sufficient pressure to the particle to deform it to cause breaking of the coating).

The polymer coated metal particles can be employed in many applications. One of the main end uses will be in the electronics industry generally and in particular in solder paste, such as is in flip-chip applications, and solder sphere application.

The polymer coated metal particles and formulation, such as solder pastes, which are made therewith, and solder spheres are particularly useful for establishing electrical interconnections between semiconductor chips and substrates.

Any type/shape of the metal particle may be used. In particular the particles may be spherical or tending toward spherical. Suitable metals of the metal particle include elemental metal such as tin, silver, copper, lead, zinc, indium, bismuth, and rare earth metals or alloys such as tin/silver/copper, tin/bismuth, tin/lead and tin/indium/bismuth alloys.

The invention also relates to a method of forming a polymer coating on a metal particle which includes the steps of:
  a) providing a plurality of metal particles;
  b) applying a cyanoacrylate or other thermally decomposable polymer such as DCPD polymers under suitable conditions so as to substantially coat at least a portion of the surface of most of the metal particles; and
  c) permitting in the case of cyanoacrylate the cyanoacrylate to cure as a polymer coating on the metal particles.

The invention also relates to a method of forming solder paste which includes the steps of:
  a) providing cyanoacrylate or other thermally decomposable polymer such as DCPD polymer coated solder powder;
  b) providing two or more of solder paste components selected from rosin, activators, rheological control agents, thickeners, or solvents; and
  c) blending the cyanoacrylate or other thermally decomposable polymers such as DCPD polymers coated solder powder with the solder paste components to form a solder paste.

By exposing the metal particles to the vapour of the acrylate component, a uniform coating of polymerised cyanoacrylate can be formed on the surface of the particles. Vapor deposition allows for uniform coatings to be applied to the particles. For example, the particles may be exposed to any suitable vapor arising at ambient temperature, or the temperature may be suitably raised to create the vapor. In the case of cyanoacrylates, the contact of the vapor with the surface of the particle may be sufficient to polymerize the reactive monomer. A fluidized bed reactor may be employed for the preparation of the coated metal particles. A vapor of the reactive monomer may be injected into the fluid bed of the reactor. Typical coatings will typically be less that 1 μm thick. It will be appreciated by those skilled in the art that other methods of applying reactive monomer to form the polymer coating are readily apparent such as placing particles in a substantially uncured amount of reactive monomer.

The invention will be described now with reference to the following non-limiting Example(s).

EXAMPLES

Example 1

Cyanoacrylate Coating Process

The cyanoacrylate coating process was designed to exclude any external catalysts so that polymerization will be initiated by the metal surface itself so that the cyanoacrylate polymer to be formed grows on metal surface.

500 g of Type 4 solder powder (Tin, Cu and Ag alloy) (average size of 30 um) was placed into a 2 L size round bottom flask along with 1 L of anhydrous toluene. 0.2 g of Butyl cyanoacrylate was then introduced and the flask was placed on a rotary evaporator, rotating the flask at 100 rpm to allow uniform mixing. After 1 hour, the reaction mixture was filtered to remove the solvent and the solder powder was rinsed twice with fresh toluene to remove any residual cyanoacrylate polymer that did not form directly on the solder powder. The coated solder powder was allowed to dry in room temperature.

Example 2

Formulation of Solder Pastes

Coated solder powders (Type 4; Tin, Cu and Ag alloy), some of which—the cyanoacrylate coated solder particles—are similar to those described in Example 1, were combined with flux and other solder paste components to form solder pastes. Some of the solder pastes were prepared with polymer coated solder powder, where the polymer coating was made from methyl methacrylate in one instance and a maleimide in another.

The performance of the solder paste, after shelf life, storage life was tested by two methods, a description of each of which follows below:
1. Solder balling test
2. Viscosity test Solder Balling Test The solder paste is printed through a stainless steel stencil onto a glass slide which is then reflowed and examined for evidence of solder balls.
  1. Using a razor blade as a squeegee, print the paste onto a glass slide using a stencil. Stencil is 0.1 mm thick with 3 holes of approximately 5 mm diameter with even spacing along the stencil.
  2. Heat the glass slide on solder bath at 250° C. for 5 seconds or until it reflows.
  3. Remove the slide from the bath and roll main ball off the slide before allowing it to cool.
  4. Assess the slide on a binocular microscope at magnification×10, by counting the number of solder balls on each print.
  5. Take the average of the lower two prints and compare to the table below.

| Observation | Assessment |
| --- | --- |
| 0-10 small balls | Pass |
| >10 small balls | Fail |

Viscosity Test

Brookfield viscometers employ the principle of rotational viscometry: the viscosity is measured by sensing the torque required to rotate a T bar spindle at constant speed while immersed in the sample. The torque is proportional to the viscous drag on the immersed spindle, and thus to the viscosity of the paste. The test is carried out at specific temperature on solder paste that has been prepared in a prescribed manner.
  1. Place sample at 25° C. for 6 hours.
  2. After 6 hours, remove sample from 25° C., open and remove internal plunger. Scrape any paste adhering to plunger and add to sample.
  3. Using spatula, stir paste gently for 30 seconds taking care to avoid the introduction of air.
  4. Use Brookfield viscometer RVDV-II+ on helipath stand with TF spindle attached. Set rotation speed to 5 rpm.
  5. Set bottom of helipath travel 40 mm below surface of paste. Set spindle 3 mm below surface of paste.
  6. Start spindle rotation and helipath stand descent.
  7. Record viscosity at lowest point of descent.

Solder powders were coated with methyl methacrylate and maleimide polymers in a process similar to that described above for cyanoacrylates, namely butyl cyanoacrylate. Performing the solder balling test on solder powders so coated showed that such solder powders are not suitable for use in solder paste formulation because the polymer is not thermally decomposable and start to degrade before reaching their ceiling temperature. As a control is the uncoated solder powder.

| Solder Balling Test | | |
| --- | --- | --- |
| Sample Control | Initial | Week 2 |
| Spot 1 | 0 | 0 |
| Spot 2 | 0 | 1 |
| Spot 3 | 1 | 0 |
| CRE1168-68B; Coated with Methyl Methacrylate | | |
| Spot 1 | 20+ | 20+ |
| Spot 2 | 20+ | 20+ |
| Spot 3 | 20+ | 20+ |

| Sample Control | Initial | Week 2 | Week 3 | Week 4 | Week 5 |
| --- | --- | --- | --- | --- | --- |
| Spot 1 | 1 | 2 | 1 | 0 | 3 |
| Spot 2 | 1 | 1 | 3 | 0 | 0 |
| Spot 3 | 0 | 0 | 0 | 0 | 1 |
| CRE1168-93B; Coated with 2-octyl cyanoacrylate | | | | | |
| Spot 1 | 1 | 0 | 2 | 0 | 0 |
| Spot 2 | 1 | 0 | 0 | 0 | 1 |
| Spot 3 | 2 | 1 | 0 | 0 | 0 |
| CRE1168-93C; Coated with 2-butyl cyanoacrylate | | | | | |
| Spot 1 | 0 | 0 | 0 | 0 | 1 |
| Spot 2 | 1 | 2 | 0 | 0 | 0 |
| Spot 3 | 0 | 0 | 1 | 2 | 1 |

The results show that the solder powders coated with methyl methacrylate failed according to the solder balling test when compared with a control, whereas polymer coatings formed from cyanoacrylates performed well as protectants for solder powder, because the cyanoacrylate polymer is thermally decomposable at solder reflow temperature.

Viscosity Test

Referring to the table below, solder powder coated with methyl methacrylate polymers did not improve performance in the viscosity test as compared with the control.

| Sample | Visc. Initial (cP) | Visc. 2 wks (cP) | Visc. 3 wks (cP) | Visc. 4 wks (cP) | Visc. 5 wks (cP) |
| --- | --- | --- | --- | --- | --- |
| Control | 1032000 | 1604000 | 1606000 | 1678000 | off scale |
| MMA Coated Sample | 1018000 | 1634000 | 1632000 | 1996000 | off scale |

Referring to the table below, solder powder coated with octyl cyanoacrylate polymers showed favourable viscosity build up over time as compared with the control, and was able to withstand 5 weeks of the viscosity test without failing whereas the control was not.

| Sample | Visc. Initial (cP) | Visc. 2 wks(cP) | Visc. 3 wks(cP) | Visc. 4 wks(cP) | Visc. 5 wks(cP) |
| --- | --- | --- | --- | --- | --- |
| Control | 1174000 | 1700000 | 1822000 | 1598000 | off scale |
| CA Coated Sample | 1164000 | 1566000 | 1516000 | 1418000 | 1542000 |

What is claimed is:

1. A metal particle having a thermally decomposable polymer coated on at least a portion of a surface thereof, wherein the thermally decomposable polymer has a ceiling temperature below a degradation temperature of the thermally decomposable polymer and below a melting point of the metal particle wherein the thermally decomposable polymer is a cyanoacrylate polymer or a dicyclopentadiene polymer; wherein the polymer coating on the metal particle is in the range from about 0.0001 to about 3.0 μm in thickness.

2. A metal particle according to claim 1 wherein the cyanoacrylate polymer is made from cyanoacrylate monomers embraced by the following structure:

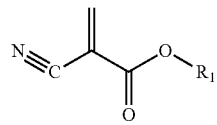

where $R^1$ is $C_1$-$C_{40}$ alkyl, $C_3$-$C_{40}$ cycloalkyl, or $C_2$-$C_{40}$ alkenyl group, with hydroxyl or alkoxy functionality and/or ether linkages being optional.

3. A metal particle according to claim 2 wherein the cyanoacrylate is selected from the group consisting of methyl, ethyl, n-propyl, iso-propyl, n-butyl, iso-butyl, sec-butyl, tert-butyl, n-pentyl, iso-pentyl, n-hexyl, iso-hexyl, n-heptyl, iso-heptyl, n-octyl, n-nonyl, allyl, methoxyethyl, ethoxyethyl, 3-methoxybutyl and methoxyisopropyl cyanoacrylate esters.

4. A metal particle according to claim 1 wherein the metal particle is solder.

5. A metal particle according to claim 1 wherein the metal particle is made from an elemental metal.

6. A metal particle according to claim 1 wherein the metal particle is made from an alloy.

7. A metal particle according to claim 1 wherein the metal particle is made from an elemental metal selected from the group consisting of tin, silver, copper, lead, zinc, indium, bismuth, and rare earth metals.

8. A metal particle according to claim 1 wherein the metal particle is made from an alloy selected from the group consisting of tin/silver/copper, tin/bismuth, tin/lead, and tin/indium/bismuth alloys.

9. A solder paste composition comprising the coated metal particle according to claim 1.

10. A solder paste composition claim 9 wherein the coated metal particles are present in amount of from about 10 to about 98% by weight with respect to the total component.

11. A metal particle according to claim 1 wherein the polymer coating on the metal particle is less than about 5 μm in thickness.

12. A metal particle according to claim 1 wherein the polymer coating on the metal particle is in the range from about from 0.001 to about 1 μm in thickness.

13. A method of forming a polymer coated metal particle of claim 1 which includes the steps of:
a) providing a plurality of metal particles;
b) applying a monomer or a thermally decomposable polymer under suitable conditions so as to substantially coat at least a portion of the surface of most of the metal particles; and
c) permitting in the case of the monomer the monomer to cure as a polymer coating on the metal particles.

* * * * *